(12) United States Patent
Rhodes et al.

(10) Patent No.: US 6,388,284 B2
(45) Date of Patent: May 14, 2002

(54) CAPACITOR STRUCTURES

(75) Inventors: Howard E. Rhodes, Boise; Lyle D. Breiner, Meridian; Philip J. Ireland, Nampa; Trung Tri Doan, Boise; Gurtej S. Sandhu, Boise; Sujit Sharan, Boise, all of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/754,924

(22) Filed: Jan. 3, 2001

Related U.S. Application Data

(62) Division of application No. 09/339,890, filed on Jun. 25, 1999, now Pat. No. 6,291,289.

(51) Int. Cl.[7] ............ H01L 27/108; H01L 29/76; H01L 29/94
(52) U.S. Cl. ............ 257/309; 257/296; 257/301; 257/303; 257/306
(58) Field of Search ............ 257/301, 303, 257/309, 306, 296

(56) References Cited

U.S. PATENT DOCUMENTS

| | | | |
|---|---|---|---|
| 5,245,206 A | * 9/1993 | Chu et al. ............ | 257/309 |
| 5,384,152 A | * 1/1995 | Chu et al. ............ | 257/309 |
| 5,418,180 A | 5/1995 | Brown ............ | 438/398 |
| 5,486,488 A | 1/1996 | Kamiyama ............ | 438/396 |
| 5,597,754 A | 1/1997 | Lou et al. ............ | 438/398 |
| 5,618,747 A | * 4/1997 | Lou ............ | 438/398 |
| 5,665,625 A | 9/1997 | Sandhu et al. ............ | 438/396 |
| 5,760,434 A | 6/1998 | Zahurak et al. ............ | 257/309 |
| 5,812,360 A | 9/1998 | Sandhu et al. ............ | 361/321.4 |
| 5,825,073 A | * 10/1998 | Radosevich et al. ............ | 257/534 |
| 5,854,734 A | 12/1998 | Sandhu et al. ............ | 361/321.5 |
| 5,872,033 A | 2/1999 | Figura ............ | 438/255 |
| 5,885,882 A | 3/1999 | Schugraf et al. ............ | 438/398 |
| 6,010,931 A | 1/2000 | Sun et al. ............ | 438/250 |

* cited by examiner

Primary Examiner—Matthew Smith
Assistant Examiner—Lex H. Malsawma
(74) Attorney, Agent, or Firm—Wells St. John P.S.

(57) ABSTRACT

Integrated circuitry capacitors and methods of forming the same are described. In accordance with one implementation, a capacitor plate is formed and a conductive layer of material is formed thereover. Preferably, the conductive layer of material is more conductive than the material from which the capacitor plate is formed. In a preferred implementation, the conductive layer of material comprises a titanium or titanium-containing layer. In another preferred implementation, the capacitor plate comprises an inner capacitor plate having an outer surface with a generally roughened surface area. In one aspect of this implementation, the roughened surface area comprises hemispherical grain polysilicon. Capacitors formed in accordance with the invention are particularly well suited for use in dynamic random access memory (DRAM) circuitry.

29 Claims, 7 Drawing Sheets

US 6,388,284 B2

CAPACITOR STRUCTURES

RELATED PATENT DATA

This patent resulted from a divisional application of U.S. patent application Ser. No. 09/339,890, filed Jun. 25, 1999, now U.S. Pat. No. 6,291,289, entitled "Capacitor Structures and Methods of Forming Capacitors", naming Howard E. Rhodes, Lyle D. Breiner, Philip J. Ireland, Trung Tri Doan, Gurtej S. Sandhu and Sujit Sharan as inventors, the disclosure of which is incorporated by reference.

TECHNICAL FIELD

This invention relates to integrated circuitry capacitors and methods of forming the same.

BACKGROUND OF THE INVENTION

One common goal in capacitor fabrication is to maximize the capacitance for a given size capacitor. It is desirable that stored charge be at a maximum immediately at the physical interface between the respective electrodes or capacitor plates and the capacitor dielectric material between the plates. Typical integrated circuitry capacitors have electrodes or plates which are formed from doped semiconductive material such as polysilicon. The polysilicon is usually heavily doped to impart a desired degree of conductivity for satisfactory capacitor plate operation.

One drawback of heavily doping polysilicon is that during operation a charge depletion region develops at the interface where charge maximization is desired. Hence, a desired level of charge storage is achieved at a location which is displaced from the interface between the capacitor plate and the dielectric material.

Another drawback of heavily doping the polysilicon capacitor plates is that during processing, some of the dopant can migrate away from the polysilicon and into other substrate structures. Dopant migration can adversely affect the performance of such structures. For example, one type of integrated circuitry which utilizes capacitors are memory cells, and more particularly dynamic random access memory (DRAM) devices. Migratory dopants from doped polysilicon capacitor plates can adversely impact adjacent access transistors as by undesirably adjusting the threshold voltages.

As the memory cell density of DRAMs increases there is a continuous challenge to maintain sufficiently high storage capacitance despite decreasing cell area. Additionally there is a continuing goal to further decrease cell area. The principal way of increasing cell capacitance heretofore has been through cell structure techniques. Such techniques include three dimensional cell capacitors such as trench or stacked capacitors.

This invention arose out of concerns associated with improving integrated circuitry capacitors. This invention also grew out of concerns associated with maintaining and improving the capacitance and charge storage capabilities of capacitors utilized in memory cells comprising DRAM devices.

SUMMARY OF THE INVENTION

Integrated circuitry capacitors and methods of forming the same are described. In accordance with one implementation, a capacitor plate is formed and a conductive layer of material is formed thereover. Preferably, the conductive layer of material is more conductive than the material from which the capacitor plate is formed. In a preferred implementation, the conductive layer of material comprises a titanium or titanium-containing layer. Other materials can be used such as chemical vapor deposited platinum, TiN, and the like. In another preferred implementation, the capacitor plate comprises an inner capacitor plate having an outer surface with a generally roughened surface area. In one aspect of this implementation, the roughened surface area comprises hemispherical grain polysilicon. Capacitors formed in accordance with the invention are particularly well suited for use in dynamic random access memory (DRAM) circuitry.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
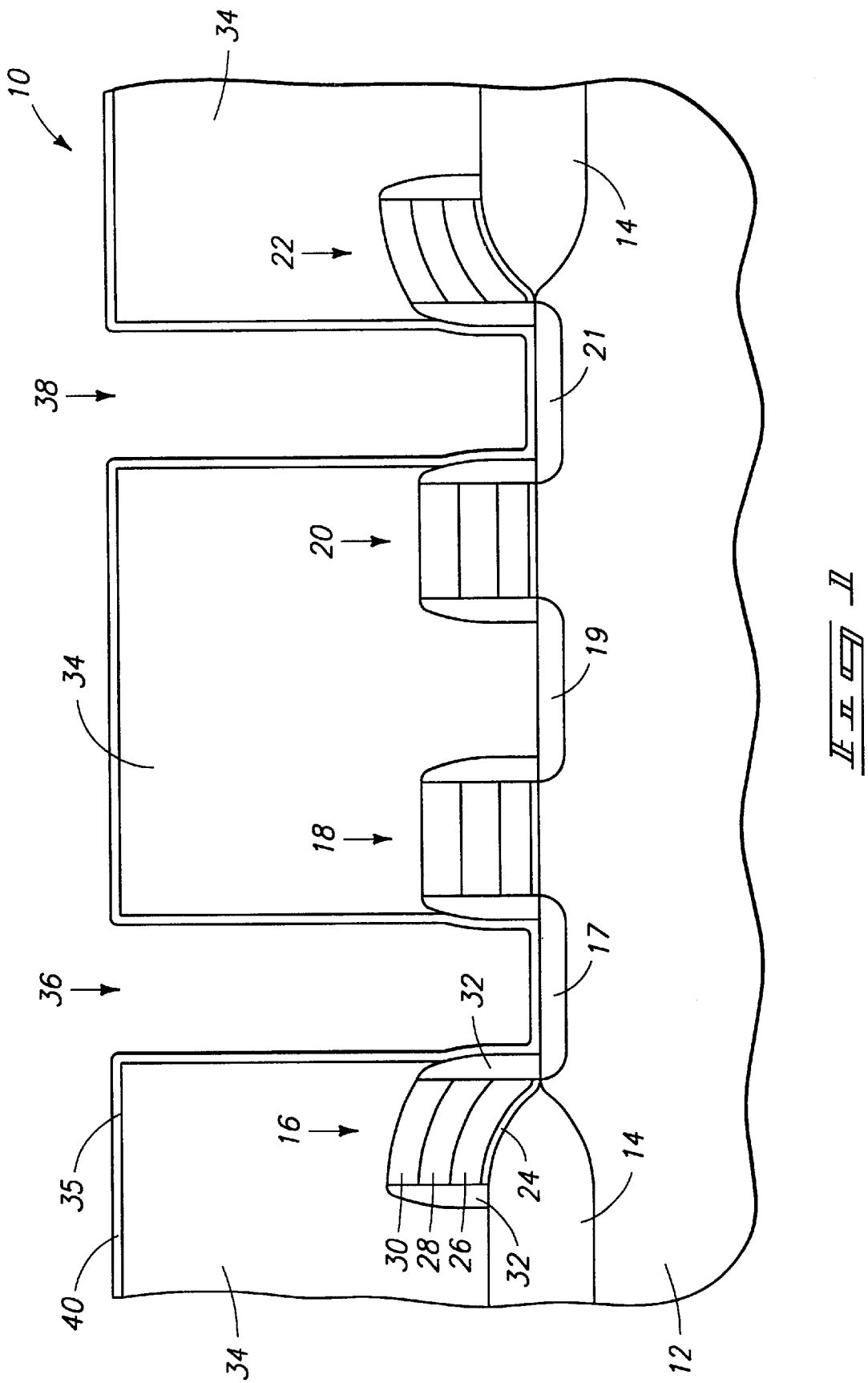
FIG. 1 is a view of a semiconductor wafer fragment undergoing processing in accordance with the invention.

Referring to FIG. 1, a semiconductor wafer fragment in process is indicated generally at 10 and includes a semiconductor substrate 12. In the context of this document, the term "semiconductor substrate" is defined to mean any construction comprising semiconductor material, including, but not limited to, bulk semiconductor materials such as a semiconductor wafer (either alone or in assemblies comprising other materials thereon), and semiconductor material layers (either alone or in assemblies comprising other materials). The term "substrate" refers to any supporting structure, including, but not limited to, the semiconductor substrates described above.

Isolation oxide regions 14 are formed relative to substrate 12 and define therebetween a substrate active area over which a plurality of capacitors are to be formed. Conductive lines 16, 18, 20, and 22 are provided over substrate 12. Such lines typically include, as shown for line 16, a thin oxide layer 24, a conductive polysilicon layer 26, a silicide layer 28, a protective insulative cap 30, and sidewall spacers 32. A plurality of diffusion regions 17, 19, and 21 are received within substrate 12 and constitute source/drain regions for transistors which serve as access transistors for the capacitors to be formed. Diffusion regions 17, 19 and 21 define substrate node locations with which electrical communication is desired. An insulative layer 34 is formed over substrate 12 and typically comprises an oxide such as borophosphosilicate glass. Of course, other materials such as phosphosilicate glass, borosilicate glass, and the like can be used. Subsequently, insulative layer 34 is patterned and etched to define openings 36, 38 over diffusion regions 17, 21 respectively, and relative to which capacitors are to be formed. Insulative layer 34 defines a substrate outer surface 35.

A first layer 40 is formed over substrate outer surface 35. An exemplary and preferred material for layer 40 comprises a conductive or semiconductive material such as conductively doped polysilicon. Layer 40 defines at least a portion of a first or inner capacitor plate. Layer 40 also has a first conductivity and defines a capacitor plate which is operably adjacent and in electrical communication with the node locations defined by diffusion regions 17 and 21. Accordingly, layer 40 is electrically connected with the node locations defined by diffusion regions 17, 21.

Figure 2:
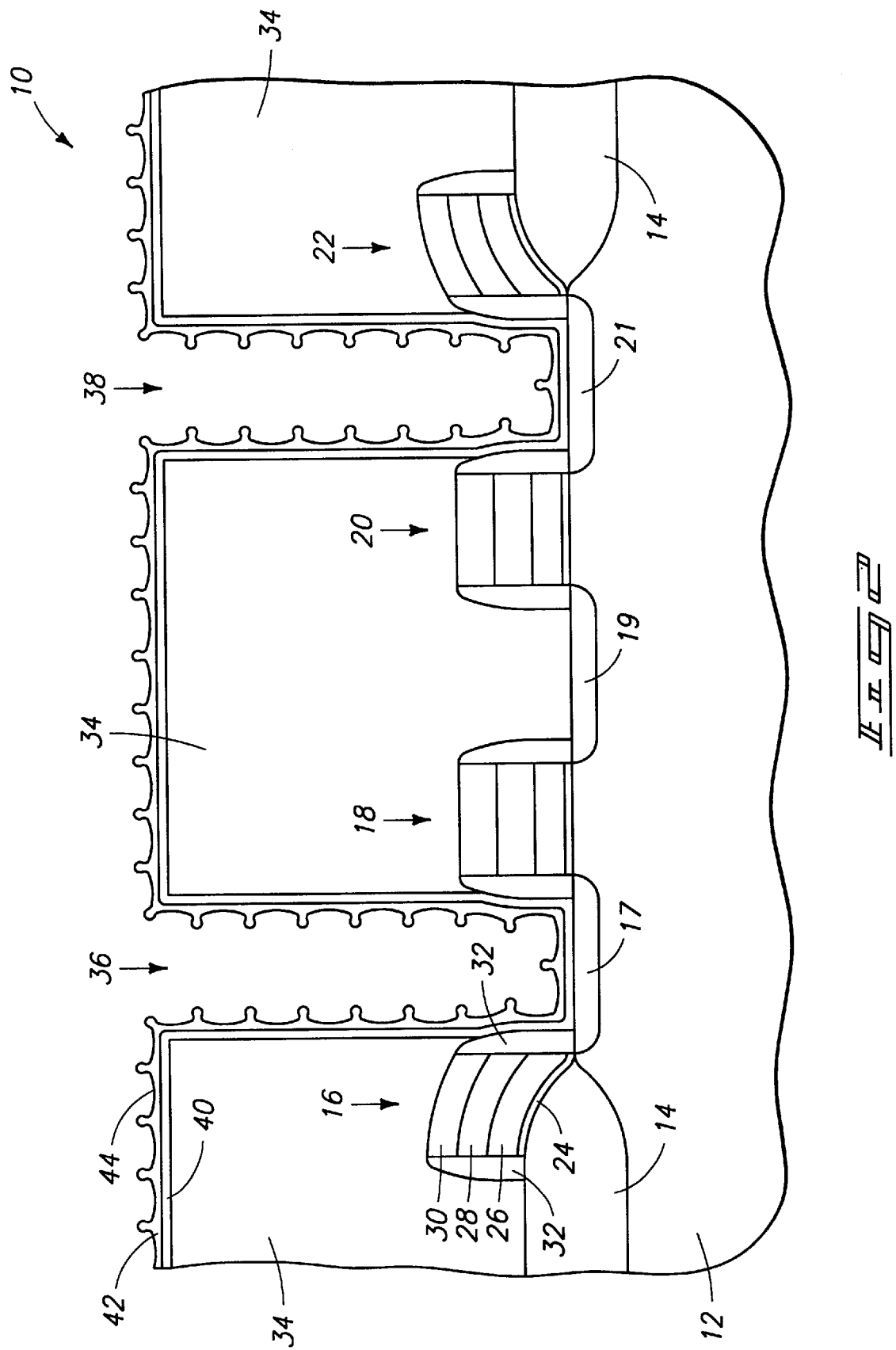
FIG. 2 is a view of the FIG. 1 wafer fragment at a processing step subsequent to that shown in FIG. 1.

Referring to FIG. 2, a second layer 42 is formed over first layer 40. In a preferred implementation, second layer 42 comprises a conductive material which constitutes roughened or rugged polysilicon. An exemplary and preferred roughened or rugged polysilicon is hemispherical grain polysilicon. Such is, in one aspect, substantially undoped as formed over first layer 40. Subsequently, and through suitable processing, outdiffusion of dopant from conductively doped polysilicon layer 40 into layer 42 renders second layer 42 conductive. Together, layers 40 and 42 constitute a doped semiconductive material having a first average conductivity. Accordingly, layers 40 and 42 constitute a first or inner capacitor plate having an outermost surface 44 of hemispherical grain polysilicon. Accordingly, outermost surface 44 defines a generally roughened surface area.

Figure 3:
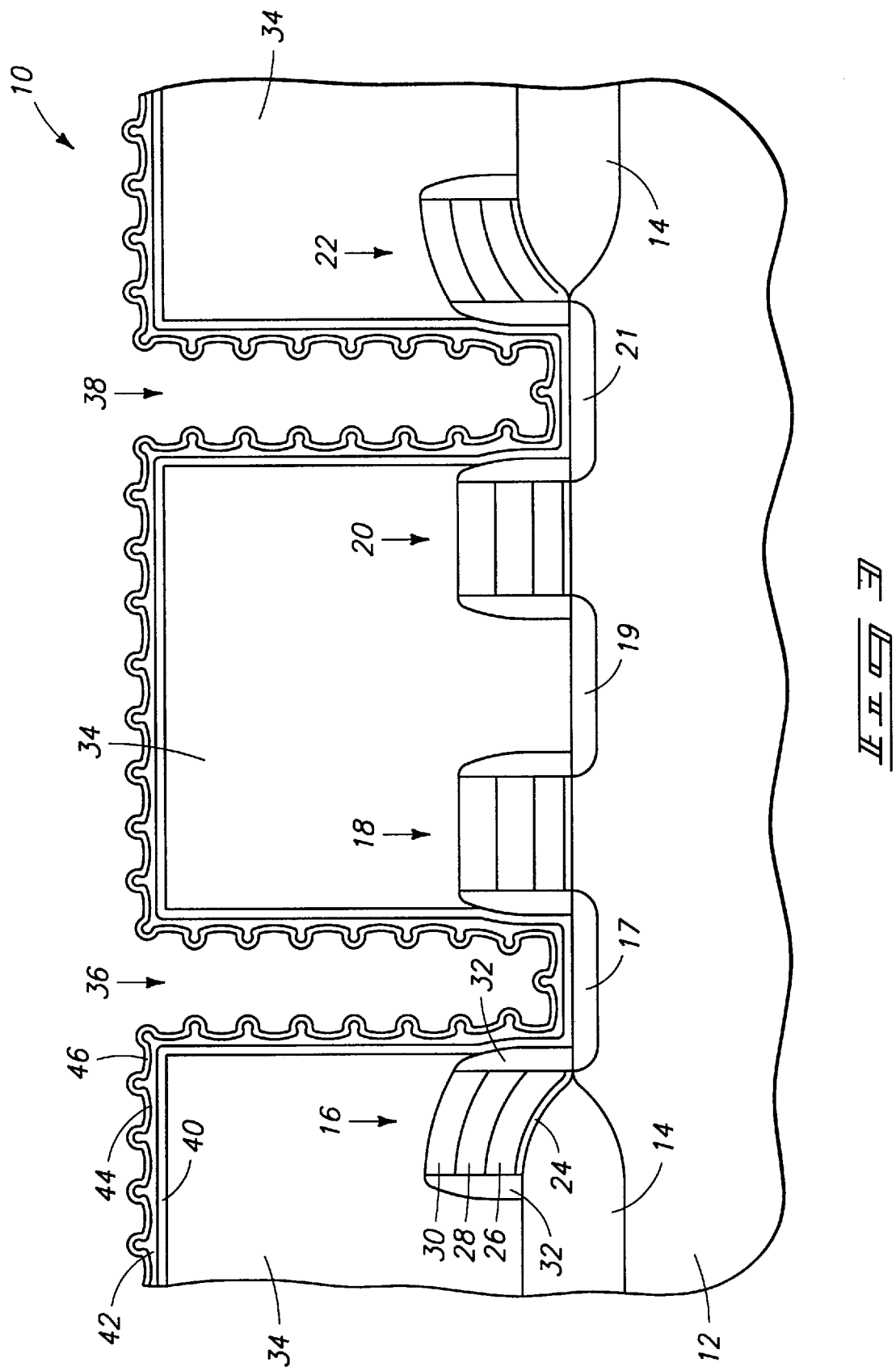
FIG. 3 is a view of the FIG. 1 wafer fragment at a processing step subsequent to that shown in FIG. 2.

Referring to FIG. 3, a layer 46 is formed over substrate 12 and outer surface 44 of layer 42. According to one aspect, layer 46 constitutes a conductive material having a second average conductivity which is greater than the first average conductivity of layers 40, 42. A preferred manner of forming layer 46 is through suitable chemical vapor deposition thereof over layer 42. Accordingly, such forms a generally conformal layer over the roughened surface area of the preferred hemispherical grain polysilicon layer 42. Hence, layer 46 is disposed over and operably adjacent layers 40, 42.

Suitable materials for layer 46 include conductive metal compounds, metal alloys, and elemental metals. Other suitable materials include those which are preferably not conductively doped semiconductive material such as polysilicon. Accordingly, layer 46 constitutes a material other than doped semiconductive material. An exemplary and preferred material for layer 46 is elemental titanium which is chemical vapor deposited over layer 42. Other materials can be used such as chemical vapor deposited platinum, TiN, and the like. Layer 46 is preferably chemical vapor deposited directly onto the hemispherical grain polysilicon material of layer 42.

Figure 4:
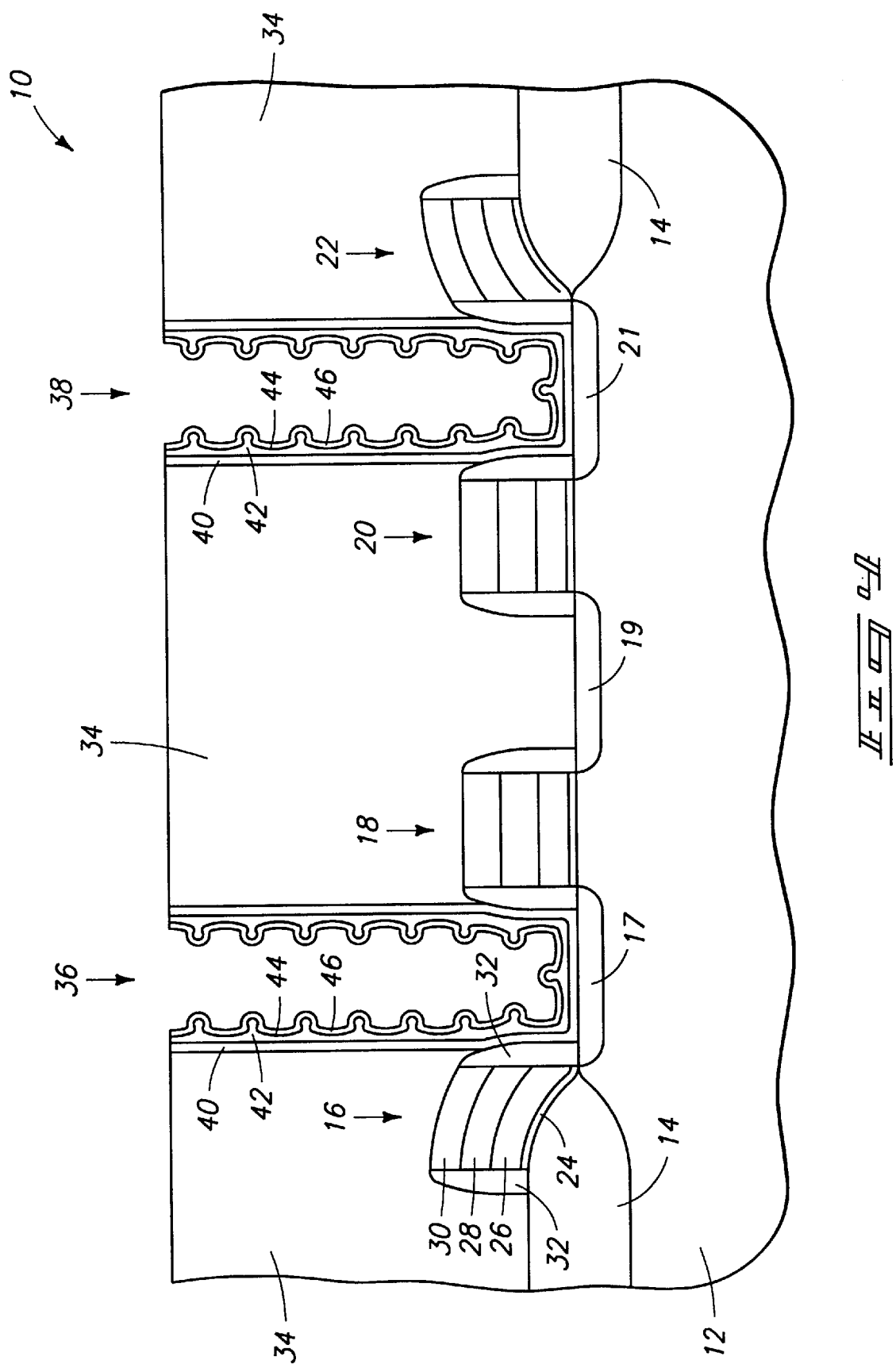
FIG. 4 is a view of the FIG. 1 wafer fragment at a processing step subsequent to that shown in FIG. 3.

Referring to FIG. 4, layers 40, 42, and 46 are planarized to electrically isolate the layers within respective opening 36, 38. Exemplary planarization techniques include mechanical abrasion of the substrate as by chemical mechanical polishing. Other techniques are possible.

Figure 5:
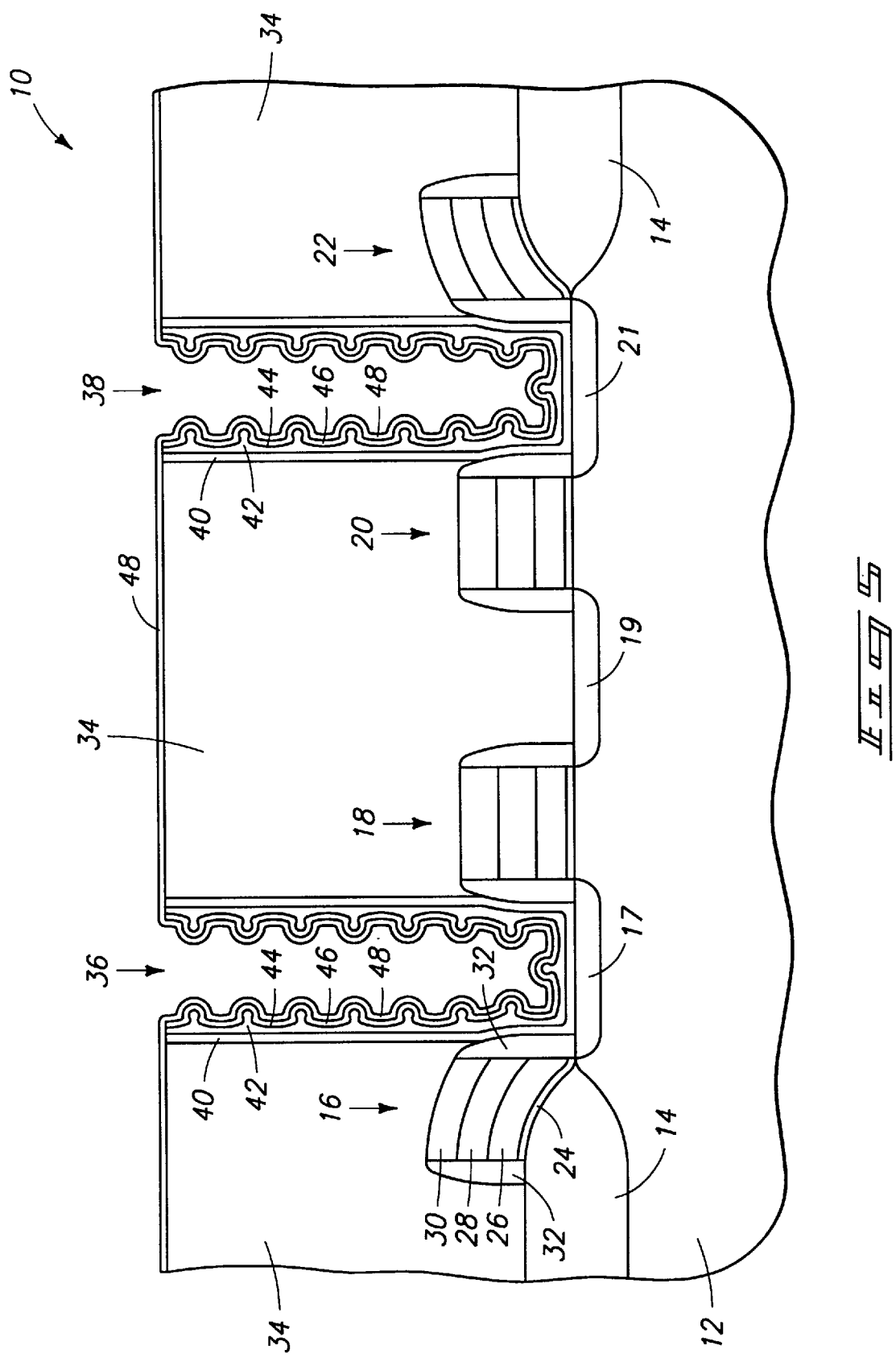
FIG. 5 is a view of the FIG. 1 wafer fragment at a processing step subsequent to that shown in FIG. 4.

Referring to FIG. 5, a capacitor dielectric layer 48 is formed operably proximate the first capacitor plate, over layer 46 and within openings 36, 38. Accordingly, layer 48 is spaced from the material of layers 40, 42 a distance which is defined by layer 46. Exemplary materials for layer 48 are $Si_3N_4$ and $SiO_2$ alone, or in combination. Other materials such as tantalum pentoxide ($Ta_2O_5$), barium strontium titanate (BST), and other dielectric materials can be used.

Alternately considered, the preferred metal layer 46 is formed intermediate conductive capacitor plate 40, 42 and capacitor dielectric layer 48 preferably by chemical vapor deposition prior to providing capacitor dielectric layer 48. As formed, metal layer 46 is at least in partial physical contacting relationship with capacitor dielectric layer 48. Accordingly, layer 46 is interposed between capacitor plate 40, 42 and dielectric layer 48. In a most preferred aspect, conductive layer 46 consists essentially of non-semiconductive material such as titanium, or titanium silicide.

Figure 6:
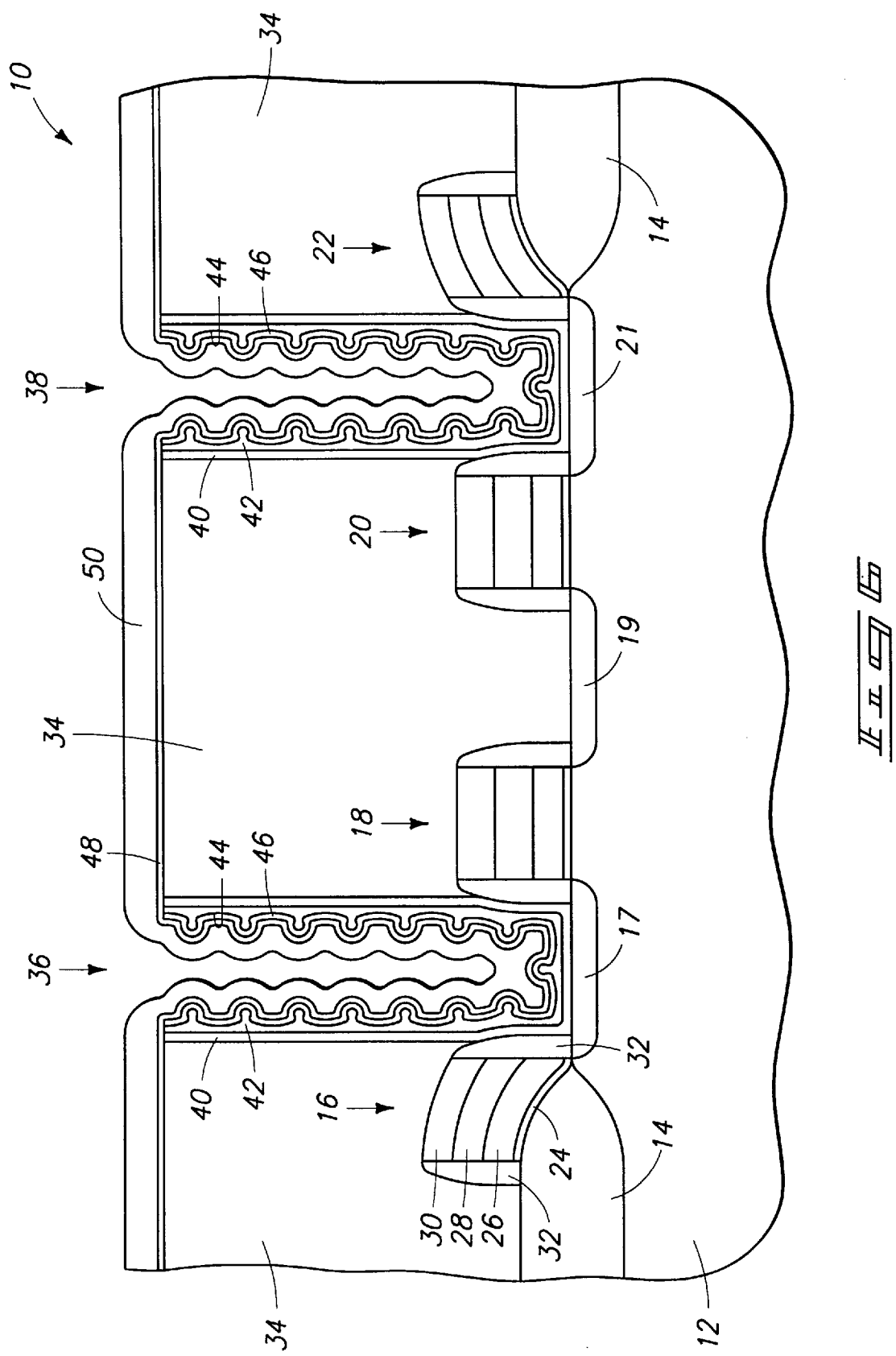
FIG. 6 is a view of the FIG. 1 wafer fragment at a processing step subsequent to that shown in FIG. 5.

Referring to FIG. 6, a second capacitor plate layer 50 is formed over dielectric layer 48 and operatively proximate layer 46. In a preferred implementation, layer 50 defines an outer capacitor plate which defines a cell plate layer of a DRAM storage capacitor. An exemplary material for capacitor plate layer 50 is polysilicon.

Figure 7:
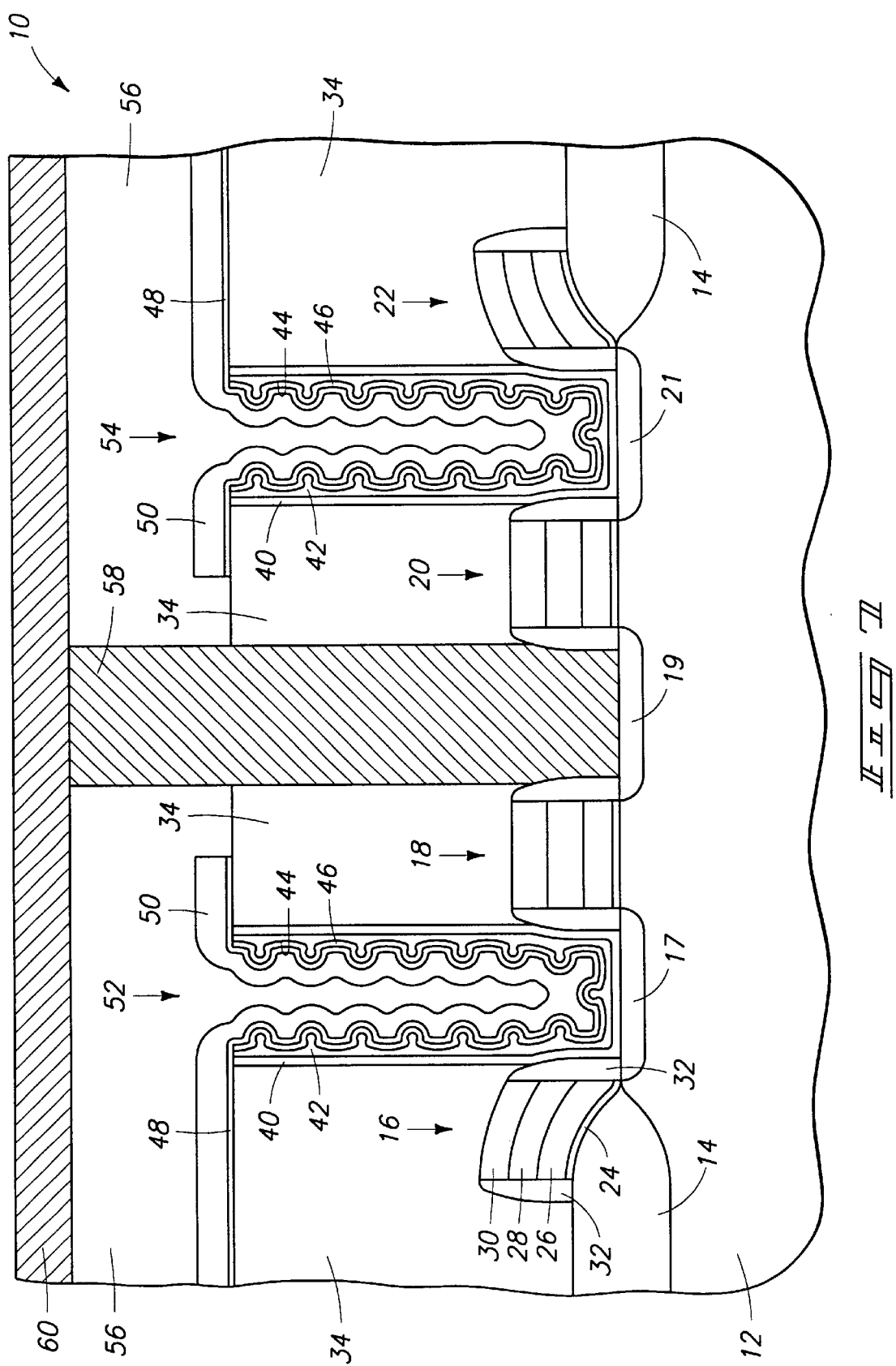
FIG. 7 is a view of the FIG. 1 wafer fragment at a processing step subsequent to that shown in FIG. 6.

Referring to FIG. 7, individual storage capacitors are patterned and etched to form capacitors 52, 54. An insulative layer 56 is formed thereover and is subsequently patterned and etched to form an opening which outwardly exposes diffusion region 19. Subsequently formed conductive material 58 provides a conductive bit line contact plug, and a subsequently formed conductive layer 60 provides a bit line in operative electrical contact therewith. Accordingly, such defines, in the illustrated and preferred embodiment, DRAM storage cells comprising storage capacitors 52, 54. The FIG. 7 construction illustrates but one example of DRAM storage cell constructions. Of course, other constructions which utilize the inventive methodology are possible The above-described methodology and capacitor constructions provide a desirable solution to concerns associated with charge depletion effects at the interface between a capacitor plate and a dielectric layer. The interpositioning of a layer of conductive material relative to the capacitor plate and the dielectric layer, which is more conductive than capacitor plate, effectively relocates the location of the capacitor's stored charge to a more desirable location. In addition, in implementations where doped semiconductive material is utilized for an inner capacitor plate and the "more conductive" interposed layer is formed thereover, a lesser degree of doping can be utilized such that dopant migration into other substrate structures is reduced. This is particularly useful when the capacitor plate includes an additional layer which is generally undoped as formed and subsequently rendered suitably conductive by outdiffusion of dopant from an adjacent layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor comprising:

a substrate having a node location;

a field effect transistor gate proximate the node location, the field effect transistor gate having a top and a sidewall proximate the node location which are covered with insulative material;

an insulative layer disposed over the substrate and on the insulative material, the insulative layer having an opening over the node location and the insulative material;

a first polysilicon material layer having a first conductivity only partially filling the insulative layer opening, the first polysilicon material layer being disposed within the opening in contacting relationship with both the insulative layer and the insulative material covering the gate sidewall, and operably connected with the node location;

a second polysilicon material layer over the first polysilicon material layer and received within and only partially filling the opening, the second polysilicon material layer having an outermost surface within the opening which has a generally roughened surface area;

a non-polysilicon conductive layer over the second polysilicon material layer's outermost surface received within and only partially filling the opening, the non-polysilicon conductive layer having a second conductivity which is greater than the first conductivity;

a capacitor dielectric layer over the conductive material layer; and a capacitor plate over the capacitor dielectric layer.

2. The capacitor of claim 1, wherein the capacitor plate comprises a cell plate layer which constitutes a portion of DRAM circuitry.

3. The capacitor of claim 1, wherein the second polysilicon material comprises hemispherical grain polysilicon.

4. The capacitor of claim 1, wherein the non-polysilicon conductive layer comprises elemental titanium or a titanium alloy.

5. The capacitor of claim 1, wherein the non-polysilicon conductive layer comprises TiN.

6. The capacitor of claim 1, wherein the non-polysilicon conductive layer comprises platinum.

7. The capacitor of claim 1 wherein the non-polysilicon layer is at least in partial physical contacting relationship with the capacitor dielectric layer.

8. The capacitor of claim 1 wherein the node location comprises a diffusion region formed in semiconductor material, and the first polysilicon material layer is formed in physical contact with the diffusion region formed in the semiconductor material.

9. A capacitor comprising:

a substrate having a node location;

a field effect transistor gate proximate the node location, the field effect transistor gate having a top and a sidewall proximate the node location which are covered with insulative material;

an insulative layer disposed over the substrate and over the insulative material, the insulative layer having an opening over the node location;

a first polysilicon material layer having a first conductivity only partially filling the insulative layer opening, the first polysilicon material layer being disposed within the opening and operably connected with the node location;

a second polysilicon material layer over the first polysilicon material layer and received within and only partially filling the opening, the second polysilicon material layer having an outermost surface within the opening which has a generally roughened surface area, the second polysilicon material layer having a planar uppermost surface;

a non-polysilicon conductive layer over the second polysilicon material layer's outermost surface received within and only partially filling the opening, the non-polysilicon conductive layer having a second conductivity which is greater than the first conductivity, the non-polysilicon conductive layer having a planar uppermost surface which is coplanar with the planar uppermost surface of the second polysilicon material layer;

a capacitor dielectric layer over the conductive material layer; and a capacitor plate over the capacitor dielectric layer.

10. The capacitor of claim 9, wherein the capacitor plate comprises a cell plates layer which constitutes a portion of DRAM circuitry.

11. The capacitor of claim 9, wherein the second polysilicon material comprises hemispherical grain polysilicon.

12. The capacitor of claim 9, wherein the non-polysilicon conductive layer comprises elemental titanium or a titanium alloy.

13. The capacitor of claim 9, wherein the non-polysilicon conductive layer comprises TiN.

14. The capacitor of claim 9, wherein the non-polysilicon conductive layer comprises platinum.

15. The capacitor of claim 9, wherein the capacitor dielectric layer is received over and contacting both the planar uppermost surface of the non-polysilicon conductive layer and the planar uppermost surface of the second polysilicon material layer.

16. A capacitor comprising:

a substrate having a node location;

a field effect transistor gate proximate the node location, the field effect transistor gate having a top and a sidewall proximate the node location which are covered with insulative material;

an insulative layer disposed over the substrate and over the insulative material, the insulative layer having an opening over the node location;

a first polysilicon material layer having a first conductivity only partially filling the insulative layer opening, the first polysilicon material layer being disposed within the opening and operably connected with the node location, the first polysilicon material layer having a planar uppermost surface;

a second polysilicon material layer over the first polysilicon material layer and received within and only partially filling the opening, the second polysilicon material layer having an outermost surface within the opening which has a generally roughened surface area, the second polysilicon material layer having a planar uppermost surface which is coplanar with the planar uppermost surface of the first polysilicon material layer;

a non-polysilicon conductive layer over the second polysilicon material layer's outermost surface received within and only partially filling the opening, the non-polysilicon conductive layer having a second conductivity which is greater than the first conductivity, the non-polysilicon conductive layer having a planar uppermost surface which is coplanar with the planar uppermost surface of the second polysilicon material layer and the planar uppermost surface of the first polysilicon material layer;

a capacitor dielectric layer over the conductive material layer; and a capacitor plate over the capacitor dielectric layer.

17. The capacitor of claim 16, wherein the capacitor plate comprises a cell plate layer which constitutes a portion of DRAM circuitry.

18. The capacitor of claim 16, wherein the second polysilicon material comprises hemispherical grain polysilicon.

19. The capacitor of claim 16, wherein the non-polysilicon conductive layer comprises elemental titanium or a titanium alloy.

20. The capacitor of claim 16, wherein the non-polysilicon conductive layer comprises TiN.

21. The capacitor of claim 16, wherein the non-polysilicon conductive layer comprises platinum.

22. The capacitor of claim 16, wherein the capacitor dielectric layer is received over and contacting each of the planar uppermost surface of the non-polysilicon conductive layer, the planar uppermost surface of the second polysilicon material layer, and the planar uppermost surface of the first polysilicon material layer.

23. A capacitor comprising:

a substrate having a node location;

a field effect transistor gate proximate the node location, the field effect transistor gate having a top and a sidewall proximate the node location which are covered with insulative material;

an insulative layer disposed over the substrate and over the insulative material, the insulative layer having an opening over the node location, the insulative layer having a planar uppermost surface;

a first polysilicon material layer having a first conductivity only partially filling the insulative layer opening, the first polysilicon material layer being disposed within the opening and operably connected with the node location;

a second polysilicon material layer over the first polysilicon material layer and received within and only partially filling the opening, the second polysilicon material layer having an outermost surface within the opening which has a generally roughened surface area;

a non-polysilicon conductive layer over the second polysilicon material layer's outermost surface received within and only partially filling the opening, the non-polysilicon conductive layer having a second conductivity which is greater than the first conductivity, the non-polysilicon conductive layer having a planar uppermost surface which is coplanar with the planar uppermost surface of the insulative layer;

a capacitor dielectric layer over the conductive material layer; and a capacitor plate over the capacitor dielectric layer.

24. The capacitor of claim 23, wherein the capacitor plate comprises a cell plate layer which constitutes a portion of DRAM circuitry.

25. The capacitor of claim 23, wherein the second polysilicon material comprises hemispherical grain polysilicon.

26. The capacitor of claim 23, wherein the non-polysilicon conductive layer comprises elemental titanium or a titanium alloy.

27. The capacitor of claim 23, wherein the non-polysilicon conductive layer comprises TiN.

28. The capacitor of claim 23, wherein the non-polysilicon conductive layer comprises platinum.

29. The capacitor of claim 23, wherein the capacitor dielectric layer is received over and contacting both the planar uppermost surface of the non-polysilicon conductive layer and the planar uppermost surface of the insulating layer.

\* \* \* \* \*